United States Patent
Inoue et al.

(10) Patent No.: US 7,449,399 B2
(45) Date of Patent: Nov. 11, 2008

(54) METHOD FOR FABRICATING A SEMICONDUCTOR DEVICE FOR REDUCING A SURFACE POTENTIAL

(75) Inventors: Kaoru Inoue, Shiga (JP); Yoshito Ikeda, Osaka (JP); Yutaka Hirose, Kyoto (JP); Katsunori Nishii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/527,695

(22) Filed: Sep. 27, 2006

(65) Prior Publication Data

US 2007/0020896 A1    Jan. 25, 2007

Related U.S. Application Data

(62) Division of application No. 10/785,944, filed on Feb. 26, 2004, now Pat. No. 7,122,451, which is a division of application No. 10/372,079, filed on Feb. 25, 2003, now Pat. No. 6,737,683.

(30) Foreign Application Priority Data

Feb. 28, 2002    (JP)    ............................. 2002-052727

(51) Int. Cl.
   *H01L 21/26*    (2006.01)
(52) U.S. Cl. ................. 438/513; 438/535; 257/E33.034
(58) Field of Classification Search ................. 438/513, 438/535, 572; 257/E33.034
See application file for complete search history.

(56) References Cited

U.S. PATENT DOCUMENTS

| 5,223,458 | A | * | 6/1993 | Shanfield et al. | ............ 438/761 |
| 6,586,781 | B2 | | 7/2003 | Wu et al. | |
| 2002/0079508 | A1 | | 6/2002 | Yoshida | |
| 2002/0137236 | A1 | * | 9/2002 | Schaff et al. | .................. 438/12 |
| 2005/0052646 | A1 | * | 3/2005 | Wohlstadter et al. | ......... 356/311 |

FOREIGN PATENT DOCUMENTS

| JP | 4-250635 | 9/1992 |
| JP | 8-097238 | 4/1996 |
| JP | 8-195403 | 7/1996 |
| JP | 2001-274140 A | 10/2001 |

OTHER PUBLICATIONS

Zhang, et al., "Effect of N2 Discharge Treatment on AlGaN/GaN High Electron Mobility Transistor Ohmic Contacts Using Inductively Coupled Plasma", J. Vac. Sci. Technol. A 18(4), Jul./Aug. 2000, p. 1149-52.

* cited by examiner

*Primary Examiner*—Hsien-ming Lee
(74) *Attorney, Agent, or Firm*—McDermott Will & Emery LLP

(57) ABSTRACT

A semiconductor device has an active region composed of a group III-V nitride semiconductor and ohmic electrodes and a gate electrode each formed on the active region. The active region has an entire surface thereof exposed to a plasma such that a surface potential for electrons therein is lower than in the case where the entire surface is not exposed to the plasma.

1 Claim, 10 Drawing Sheets

METHOD FOR FABRICATING A SEMICONDUCTOR DEVICE FOR REDUCING A SURFACE POTENTIAL

RELATED APPLICATIONS

This application is a divisional of application Ser. No. 10/785,944, filed Feb. 26, 2004, now U.S. Pat. No. 7,122,451, which is a divisional of application Ser. No. 10/372,079, filed Feb. 25, 2003, now U.S. Pat. No. 6,737,683, which claims priority of Japanese Patent application No. 2002-052727, filed Feb. 28, 2002, the contents of which are herewith incorporated by reference.

BACKGROUND OF THE INVENTION

The present invention relates to a semiconductor device composed of a group III-V nitride semiconductor represented by a general formula $(In_XAl_{1-X})_YGa_{1-Y}N$ (where $0 \leq X \leq 1$ and $0 \leq Y \leq 1$ are satisfied) and to a method for fabricating the same.

A group III-V nitride semiconductor such as GaN, AlGaN, InGaN, or InAlGaN, i.e., a so-called gallium nitride-based semiconductor is an important semiconductor for an optical device having a short oscillating wavelength such as a semiconductor laser device outputting, e.g., a blue laser beam. The applications of the gallium nitride-based semiconductor are not limited to the optical device. In recent years, attention has been focused on the gallium nitride-based semiconductor for its high dielectric breakdown field strength, high thermal conductivity, and high electron saturation velocity so that gallium nitride-based semiconductor is considered to be promising also as the material of an RF power device.

In an AlGaN/GaN heterojunction structure composed of aluminum gallium nitride (AlGaN) and gallium nitride (GaN) which are stacked in layers, in particular, electrons are accumulated at a high density in the vicinity of the heterojunction interface between AlGaN and GaN to form a so-called two-dimensional electron gas. The two-dimensional electron gas exhibits a high mobility since it exists spatially separated from a donor impurity used to dope AlGaN. Therefore, the AlGaN/GaN heterojunction structure achieves the effect of reducing a source resistance component when used in a field effect transistor (FET).

Since the distance d from a gate electrode to the two-dimensional gas is normally as small as several tens of nanometers, a ratio Lg/d between a gate length Lg and the distance d, which is termed an aspect ratio, can be held at a large value of 5 to 10 even if the gate length Lg is as small as about 100 nm. Hence, the use of the AlGaN/GaN heterojunction structure offers an advantage of easy fabrication of a FET with a reduced short channel effect and an excellent saturation characteristic.

The electron velocity of a two-dimensional electron in a high-field region of about $1 \times 10^5$ V/cm in the AlGaN/GaN-based heterojunction structure is double or more the electron velocity thereof in a gallium arsenide-based (GaAs-based) FET which is currently prevalent as an RF transistor, i.e., an AlGaAs/InGaAs heterostructure FET. In addition, the density of electrons accumulated at the heterointerface becomes as high as $1 \times 10^{13}/cm^2$ when the composition of Al in AlGaN is 0.2 to 0.3, which is about three to five times as high as the density of electrons in the GaAs-based device. Accordingly, the FET having a GaN heterojunction structure is considered to be very promising.

However, the FET having a GaN heterojunction structure has the problem that it is difficult to form a gate electrode on the bottom surface of a recess provided in the upper semiconductor thereof, i.e., a so-called recessed gate structure.

The reasons for this is that AlGaN and GaN in, e.g., an AlGaN/GaN heterojunction structure have different lattice constants and therefore an upper semiconductor layer composed of AlGaN cannot be formed sufficiently thick on a lower semiconductor layer composed of GaN and that wet etching is difficult because AlGaN is a chemically extremely stable material. Accordingly, a conventional FET with a GaN-based heterojunction structure mostly has a structure in which ohmic electrodes as source/drain electrodes and a gate electrode are disposed on a principal surface of the upper semiconductor layer composed of AlGaN, not a recessed gate structure.

Thus, in the structure in which the individual electrodes are formed on the same surface, it is difficult to sufficiently reduce the value of a source-to-gate resistance so that excellent physical properties inherent to the materials composing the GaN-based heterojunction structure FET cannot be obtained.

Since the thickness of the upper semiconductor layer composed of AlGaN is particularly small between the gate and source, an electron density in the region lowers directly if a surface potential for electrons is increased by any factor in the fabrication process. No matter how intensively a gate voltage with a positive value is applied to the gate electrode, the electron density in a region under the gate electrode cannot be increased to a value not more than a maximum electron density determined in the region between the source and drain electrodes. The phenomenon in which the surface potential for electrons is increased by any factor in the fabrication process is fatal to the GaN-based heterojunction FET.

This raises a demand for a structure in which the thickness of the region of the upper semiconductor layer composed of AlGaN which is located between the source and drain is increased such that an electron density between the source and gate is not affected by a variation in surface potential, i.e., a recessed gate structure. However, the use of a recessed gate structure in a FET having a GaN-based heterojunction structure is technically difficult, as described above, so that it is necessary to minimize the surface potential between the source and drain.

SUMMARY OF THE INVENTION

The present invention has been achieved in view of the foregoing problems and it is therefore an object of the present invention to reduce a surface potential for electrons in a group III-V nitride semiconductor and thereby reduce a source resistance, improve a drain current value, and increase a drain breakdown voltage.

Specifically, a first method for fabricating a semiconductor device according to the present invention comprises the steps of: (a) exposing a surface of an active region composed of a group III-V nitride semiconductor to a plasma to reduce a surface potential for an electron in the active region; and (b) selectively forming an ohmic electrode and a gate electrode on the active region with the reduced surface potential.

Since the first method for fabricating a semiconductor device selectively forms the ohmic electrode and the gate electrode on the active region with the reduced surface potential, a source resistance is reduced and a transconductance is increased. This advantageously increases a drain current as well as a drain breakdown voltage.

In the first method for fabricating a semiconductor device, the step (a) is preferably performed under a pressure not more than 100 Pa.

A second method for fabricating a semiconductor device according to the present invention comprises the steps of: (a) selectively forming an ohmic electrode and a gate electrode on an active region composed of a group III-V nitride semiconductor; and (b) exposing the active region to a plasma by using the ohmic electrode and the gate electrode as a mask to reduce a surface potential for an electron in an exposed region of the active region.

In the first method for fabricating a semiconductor device, the step (b) is preferably performed under a pressure not more than 100 Pa.

A first semiconductor device according to the present invention comprises: an active region composed of a group III-V nitride semiconductor; and a gate electrode formed on the active region and source and drain electrodes each formed in spaced apart relation to the gate electrode, a portion of the active region interposed between the gate electrode and the source electrode having a surface thereof exposed selectively to a plasma such that a surface potential for an electron is lower therein than in the other portion of the active region.

In the first semiconductor device, a source resistance is reduced and a transconductance is increased so that a drain current is increased advantageously.

In the first semiconductor device, it is preferable for a portion of the active region interposed between the gate electrode and the drain electrode also to have a surface thereof exposed selectively to the plasma such that a surface potential for an electron is lower therein than in the other portion of the active region.

This also reduces a drain resistance so that the drain current is further increased.

A second semiconductor device according to the present invention comprises: an active region composed of a group III-V nitride semiconductor; and an ohmic electrode and a gate electrode each formed on the active region, the active region having an entire surface thereof exposed to a plasma such that a surface potential for an electron therein is lower than in the case where the entire surface is not exposed to the plasma.

In the second semiconductor device, a source resistance is reduced and a drain current is increased advantageously, while a gate-to-drain breakdown voltage is also increased advantageously.

A third semiconductor device according to the present invention comprises: a plurality of field effect transistors each having an active region composed of a group III-V nitride semiconductor, at least one of the plurality of the field effect transistors having a surface of the active region thereof being exposed selectively to a plasma such that a surface potential for an electron is lower therein than in the respective active regions of the other field effect transistors unexposed to the plasma.

In the third semiconductor device, the FETs having different threshold voltages can be formed on a single substrate.

In the first to third semiconductor devices, the active region exposed to the plasma is preferably exposed to the plasma under a pressure not more than 100 Pa.

DETAILED DESCRIPTION OF THE INVENTION

Figure 1:
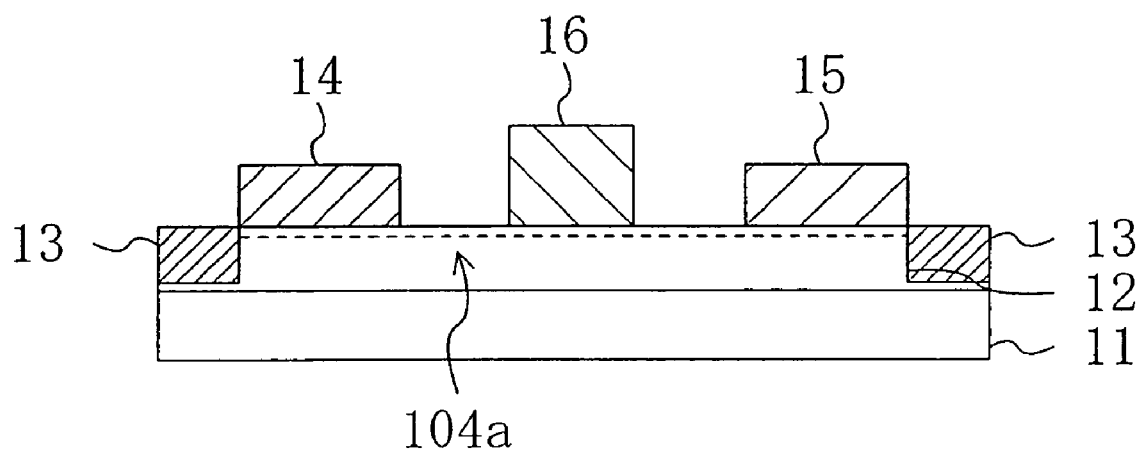
FIG. 1 is a structural cross-sectional view of a semiconductor device according to a first embodiment of the present invention.

A description will be given first to technology for reducing a surface potential for electrons in a group III-V nitride semiconductor, especially a GaN-based semiconductor.

The technology for changing the properties of the surface of a GaN-based semiconductor by exposing the semiconductor surface to a plasma without substantially etching the surface thereof has been well known. There has already been a report on a surface treatment using a nitrogen ($N_2$) plasma or an ammonia ($NH_3$) plasma.

The present inventors have already disclosed that, if a plasma process is performed with respect to the surface of the GaN-based semiconductor by using an ammonia plasma, the adhesion strength of the silicon oxide film deposited on the GaN-based semiconductor is increased after the plasma process and the ideal factor (n value) of a Schottky electrode formed on the surface of the GaN-based semiconductor after the plasma process is slightly improved. The reason for the improved adhesion strength and the improved factor may be that the surface of the GaN-based semiconductor is cleaned and activated by the plasma process.

In a FET formed after an ammonia plasma process is performed, by contrast, the threshold value thereof is substantially the same as the threshold value when the plasma process is not performed or the absolute value of the threshold value tends to be slightly smaller (shallower). The plasma process is performed by using a well-known (commercially available) plasma etching system under the conditions that the flow rate of an ammonia gas is about 0.1 L/min (0° C., 1 atom), a pressure is about 133 Pa (=1 Torr), a power is 30 W, the distance between electrodes is 20 mm, and a process time is 5 minutes. To reduce damage given to a sample (semiconductor) by the plasma process, the power is set to a low value which is ⅓ to ¼ of the power used normally for plasma etching. In the present specification, the conditions for the plasma process will be termed the conditions A. Although the conditions A may vary if another plasma etching system is used and are therefore far from general conditions, they will be treated as reference data.

This time, the present inventors have found that a large change occurs in the operating characteristics of a FET formed after performing a surface treatment with respect to a GaN-based semiconductor by using the foregoing plasma etching system, reducing the flow rate of a plasma to a value which is about ⅓ to ¼ of the flow rate under the conditions A, and adjusting the pressure to a high degree of vacuum of about 40 Pa. Conditions for the plasma process according to the present invention will be termed conditions B.

The conditions B according to the present invention are such that the flow rate of an ammonia gas is about 0.025 L/min to 0.033 L/min (0° C., 1 atom), a chamber pressure is about 40 Pa, a power is 30 W, the distance between electrodes is 20 mm, and a process time is 5 minutes.

Embodiment 1

A first embodiment of the present invention will be described with reference to the drawings.

FIG. 1 shows a cross-sectional structure of a MESFET (Metal Semiconductor FET) as a semiconductor device according to the first embodiment. As shown in FIG. 1, an epitaxial layer 12 composed of a GaN-based semiconductor is formed on a substrate 11 composed of, e.g., sapphire. An isolation region 13 for defining the active region of the transistor is formed in the epitaxial layer 12.

The isolation region may be formed by implanting nitrogen (N) ions or carbon (C) ions or by selectively oxidizing the epitaxial layer 12.

A source electrode 14 and a drain electrode 15 are formed as ohmic electrodes on the both end portions of the epitaxial layer 12 on the active region. A gate electrode 16 composed of metal is formed on the center portion of the active region in spaced apart relation to the source electrode 14 and the drain electrode 15.

The first embodiment is characterized in that a modified layer 104a obtained by exposing an entire surface of the epitaxial layer 12 to an ammonia plasma is formed in the surface region of the epitaxial layer 12.

Figure 2:
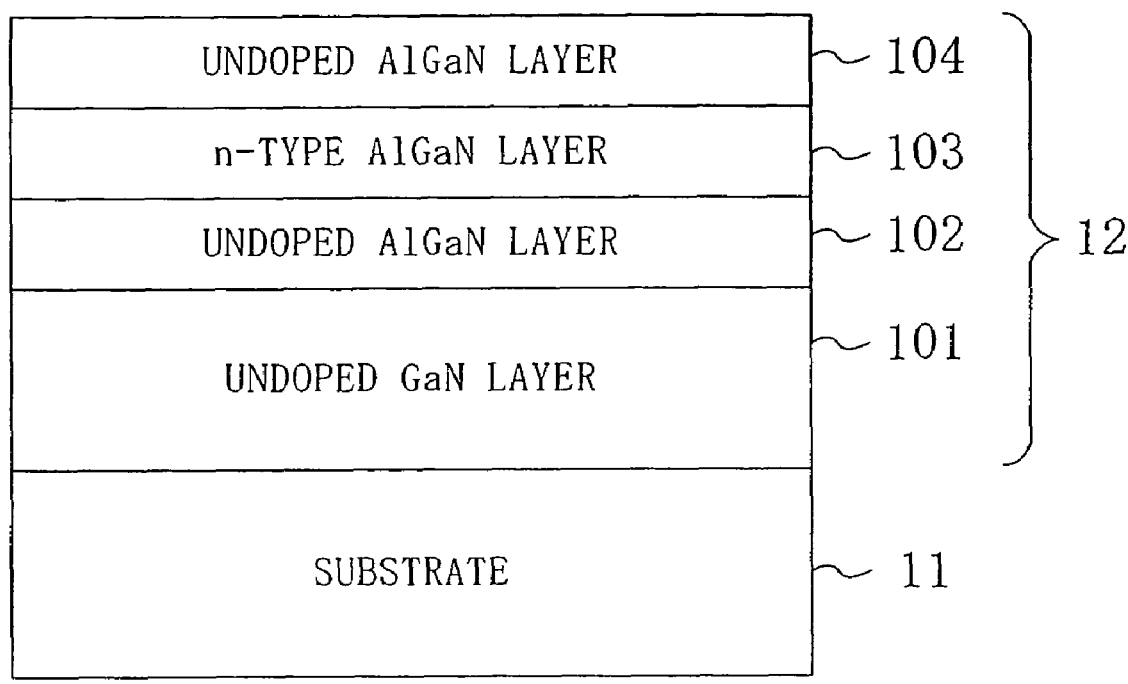
FIG. 2 is a structural cross-sectional view showing an epitaxial layer in the semiconductor device according to the first embodiment.

FIG. 2 shows an example of the epitaxial layer 12 according to the first embodiment.

As shown in FIG. 2, the epitaxial layer 12 consisting of a buffer layer 101 composed of undoped gallium nitride (GaN) with a thickness of about 3 μm, a first semiconductor layer 102 composed of undoped aluminum gallium nitride (AlGaN) with a thickness of about 2 nm, a second semiconductor layer 103 composed of n-type AlGaN with a thickness of about 15 nm, and a third semiconductor layer 103 composed of undoped AlGaN with a thickness of about 3 nm is formed on the substrate 11.

The composition of Al in AlGaN is 25% and an amount of silicon as an n-type dopant in the second semiconductor layer 103 is $4 \times 10^{18}/cm^3$. An electron mobility and an electron density in the epitaxial layer 12 are about 1400 $cm^2/Vs$ and $1 \times 10^{13}/cm^2$, which indicate relatively excellent electric characteristics.

A description will be given herein below to a method for fabricating the MESFET thus constructed with reference to the drawings.

Figure 3A:
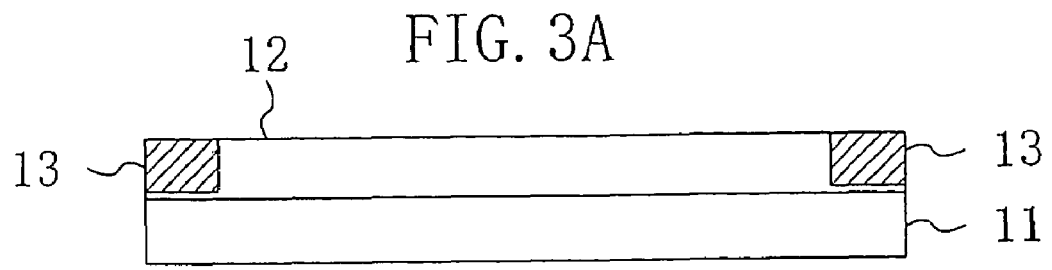
FIGS. 3A to 3C are structural cross-sectional views illustrating the individual process steps of a method for fabricating the semiconductor device according to the first embodiment.
Figure 3B:
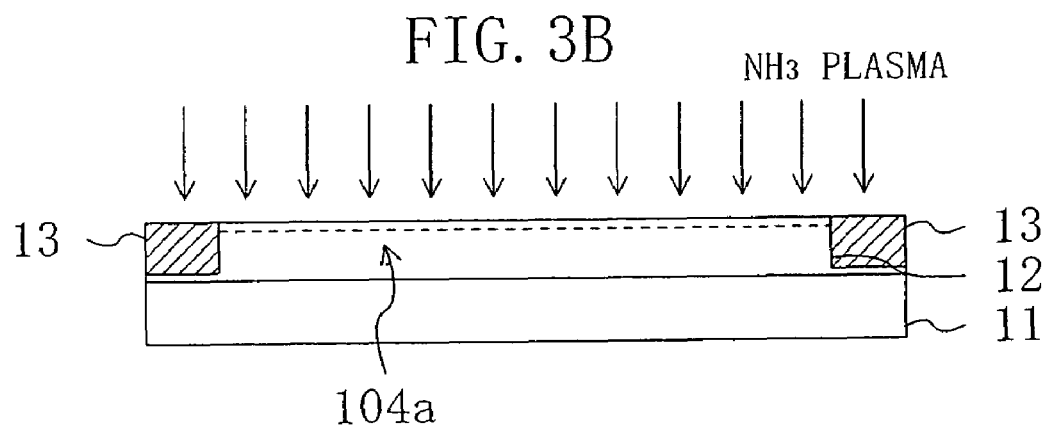
Figure 3C:
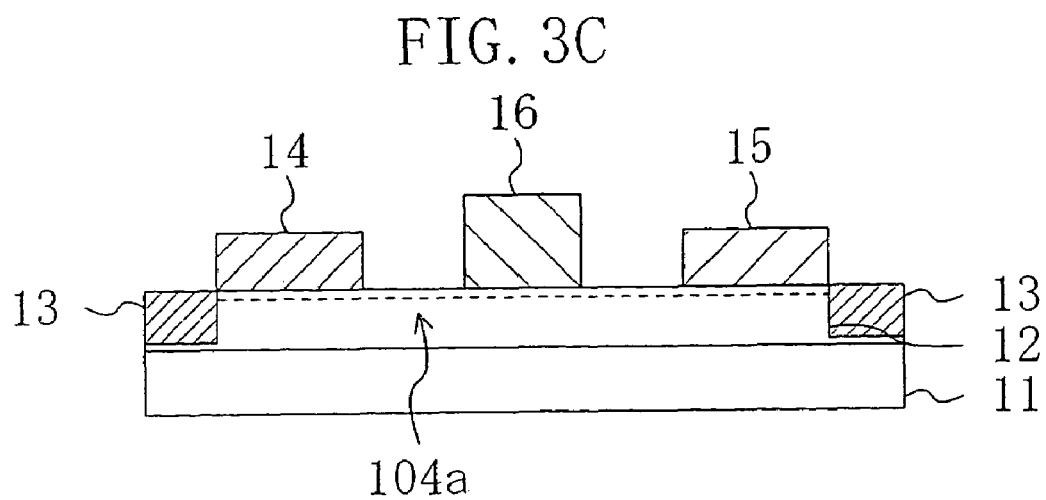

FIGS. 3A to 3C show respective cross-sectional structures of the MESFET according to the first embodiment in the individual process steps of the fabrication method therefor. The description of the components which are shown in FIGS. 3A to 3C and also shown in FIG. 1 will be omitted by retaining the same reference numerals.

First, as shown in FIG. 3, the epitaxial layer 12 is formed by, e.g., metal organic chemical vapor deposition (MOCVD) on a principal surface of the substrate 11 composed of sapphire.

Next, as shown in FIG. 3B, the epitaxial layer 12 is exposed to an ammonia ($NH_3$) plasma under the conditions B. By the plasma process performed under the conditions B, the modified layer 104a obtained by modifying the surface of the third semiconductor layer 104 composed of AlGaN by using the ammonia plasma is formed in the surface region of the epitaxial layer 12 located between the source electrode 14 and the gate electrode 16.

Next, a resist pattern (not shown) having openings corresponding to ohmic electrode formation regions is formed on the epitaxial layer 12. Then, an electrode forming film composed of titanium (Ti) with a thickness of about 20 nm and aluminum (Al) with a thickness of about 100 nm is formed successively by vacuum deposition and the source electrode 14 and the drain electrode 15 are formed subsequently from the electrode forming film by a so-called lift-off process. Then, a heat treatment is performed in a hydrogen atmosphere at a temperature of about 550° C. for 1 minute. Thereafter, a metal film composed of nickel (Ni) with a thickness of about 200 nm is deposited by vacuum deposition on the gate electrode formation region of the epitaxial layer 12. A gate electrode 16 is formed from the deposited metal film by a lift-off process to be located between the source electrode 14 and the drain electrode 15.

Figure 4A:
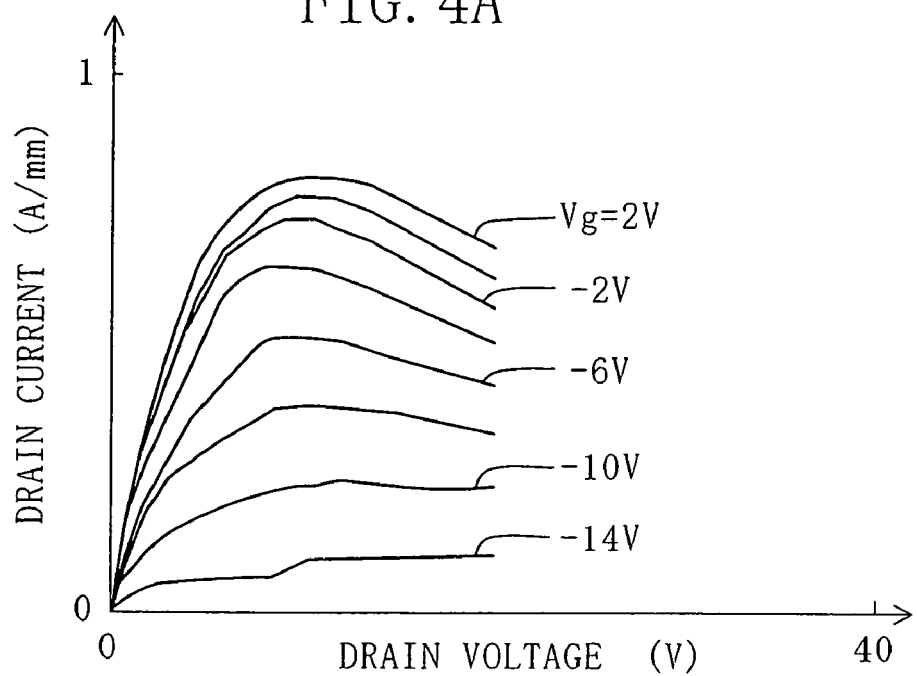
FIG. 4A is a graph showing a drain power-voltage characteristic in the semiconductor device according to the first embodiment.

FIG. 4A shows a drain current-voltage characteristic in the MESFET according to the first embodiment. As shown in FIG. 4A, a drain current value as high as 800 mA/mm and a threshold voltage with a large absolute value of about −14 V (deep threshold voltage) are observed when the gate voltage Vg is 2 V. In the region in which the gate voltage Vg is higher (shallower) than −4 V, a variation in drain current in response to an increase in gate voltage Vg is small, which indicates that electrons flow in the third semiconductor layer 104 composed of AlGaN in the region where a variation in drain current is small. It was recognized that the value of a maximum saturation current in the epitaxial layer 12 before the gate electrode 16 is formed was 800 mA/mm.

Figure 4B:
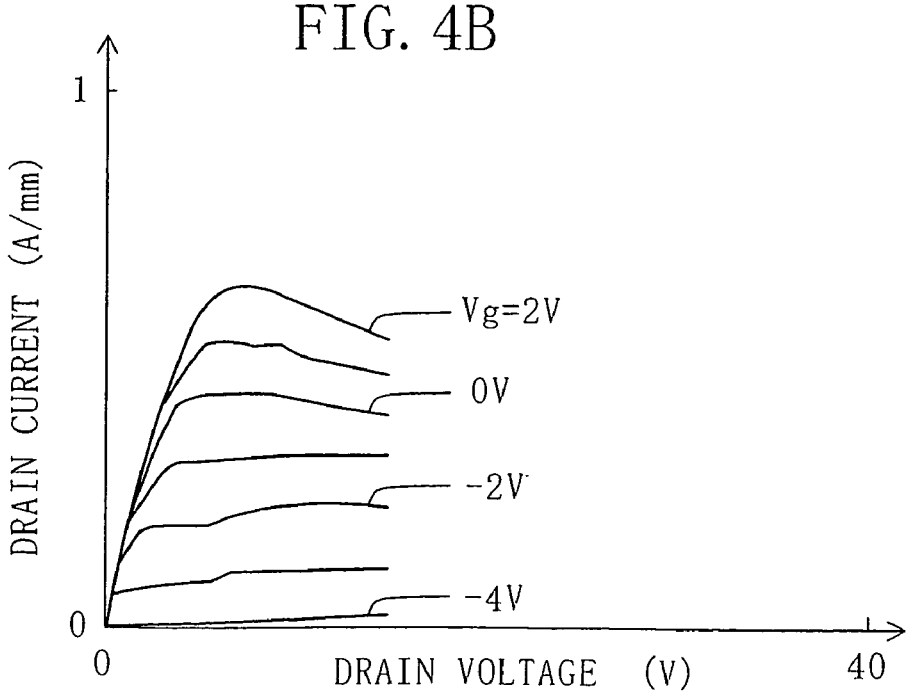
FIG. 4B is a graph showing a drain power-voltage characteristic in a semiconductor device for comparison formed under plasma process conditions A.

By contrast, FIG. 4B shows a drain current-voltage characteristic in a MESFET for comparison when a plasma process was performed under the conditions A. The maximum drain current in FIG. 4B is 630 mA/mm when the gate voltage Vg is 2 V. The threshold voltage is about −4 V, which indicates a substantially equal characteristic shown by a FET to which a plasma process has not been performed.

From the foregoing, it can be considered that any positive discharge has obviously been generated in the surface of the epitaxial layer 12 when the plasma process was performed under the conditions B according to the present invention. This indicates that a potential for electrons in the surface of the third semiconductor layer 104 composed of AlGaN is reduced. When the plasma process was performed under the conditions B, the operating characteristics of the MESFET are extremely stable and measurement reproducibility is excellent. Variations in threshold voltage are not largely dependent on the power for generating the plasma but are most largely dependent on the pressure (degree of vacuum) during the plasma process.

Accordingly, the amount of positive charge generated in the surface region of the semiconductor can be controlled by setting, to proper values, the flow rate and pressure (about 40 Pa to 133 Pa) of a gas during the plasma process.

Figure 5:
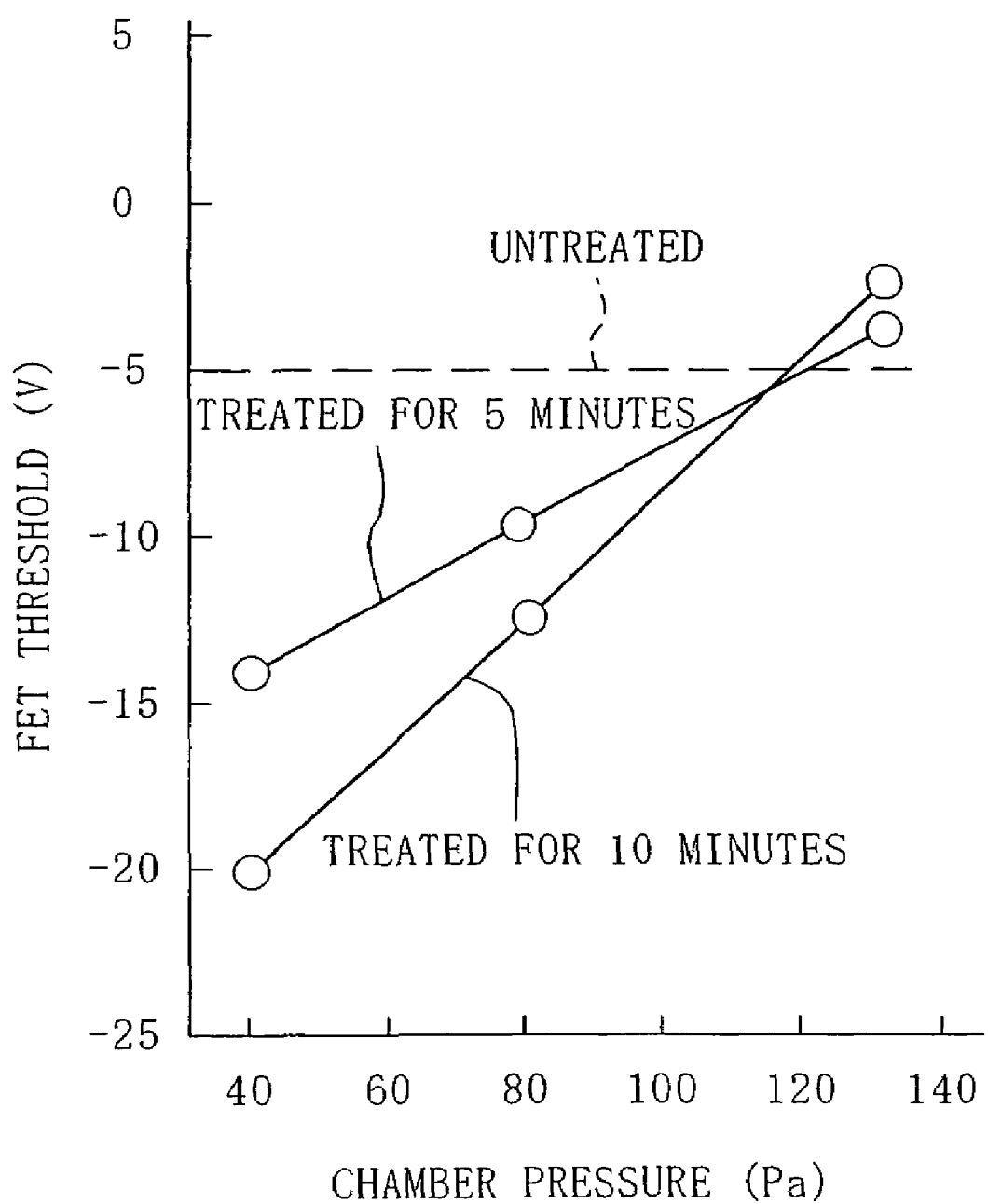
FIG. 5 shows a relationship between a chamber pressure and the threshold voltage of a MESFET in a plasma process in the method for fabricating the semiconductor device according to the first embodiment.

FIG. 5 shows the dependence of a threshold voltage in the MESFET according to the first embodiment on the pressure during the plasma process. In FIG. 5, a broken line indicates the threshold voltage of the MESFET when a plasma process has not been performed. As shown in FIG. 5, the threshold voltage of the MESFET is dependent on the chamber pressure during the plasma process and also on the process time. It can be seen that, if the plasma process is performed in a region where the degree of vacuum is relatively as high as about 100 Pa or less, the threshold value remarkably changes in a negative direction. It can also be seen that, if the plasma process is performed in a region where the degree of vacuum is relatively as low as 120 Pa or more, on the other hand, the threshold voltage changes in a positive direction.

Thus, from the results shown in FIG. 5, it can be concluded that a chamber pressure of 100 Pa or less is suitable for reducing the surface potential of the GaN-based semiconductor.

The foregoing result shows that the surface potential of the GaN-based semiconductor can be reduced by reducing the pressure of an atmosphere in performing a plasma process. Since the MESFET to which the plasma process under the pressure (at a high degree of vacuum) has been performed has stable operating characteristics and excellent reproducibility, it can be assumed that the positive charge fixed by the plasma process has been generated in the surface region of the epitaxial layer 12 composed of the GaN-based semiconductor.

Embodiment 2

A second embodiment of the present invention will be described with reference to the drawings.

Figure 6:
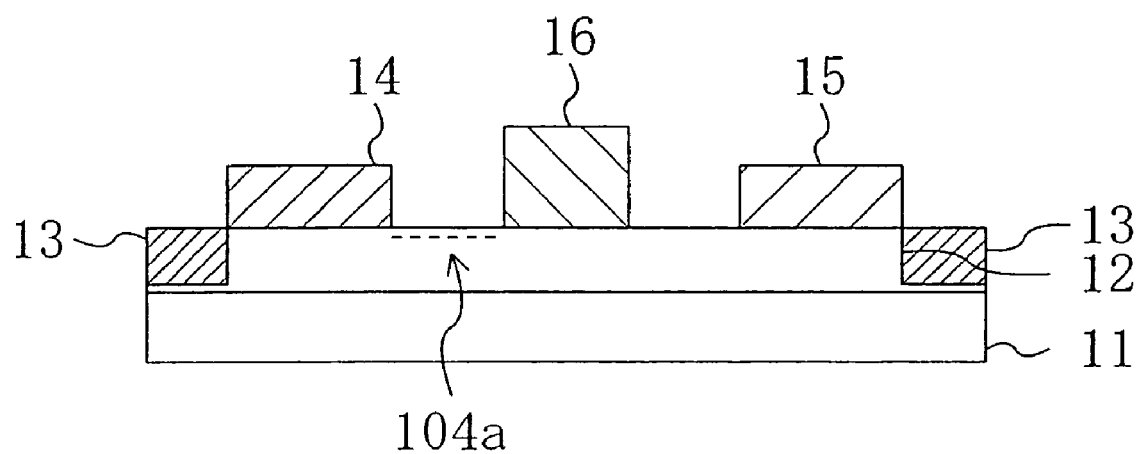
FIG. 6 is a structural cross-sectional view of a semiconductor device according to a second embodiment of the present invention.

FIG. 6 shows a cross-sectional structure of a MESFET as a semiconductor device according to the second embodiment. The description of the components which are shown in FIG. 6 and also shown in FIG. 1 will be omitted by retaining the same reference numerals.

The second embodiment is characterized in that a modified layer 104a obtained by exposing the surface of the epitaxial layer 12 to an ammonia plasma is formed selectively in the surface region of an epitaxial layer 12 located between a source electrode 14 and a gate electrode 16. A material composing the substrate 11 is not limited to sapphire. Silicon carbide (SiC) may also be used instead.

A description will be given herein below to a method for fabricating the MESFET thus constructed with reference to the drawings.

Figure 7A:
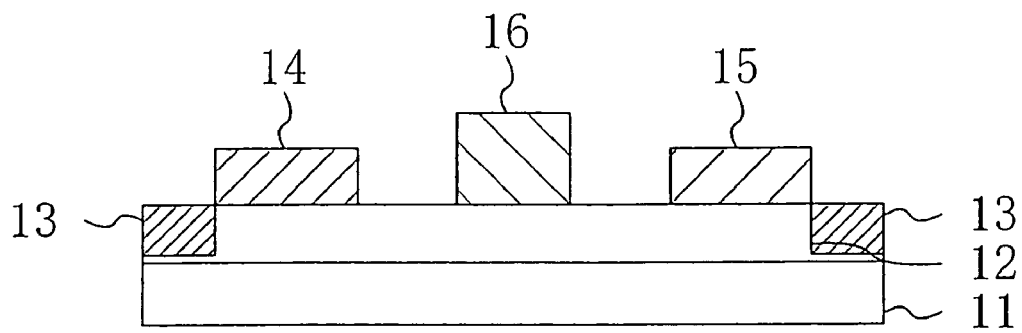
FIGS. 7A to 7C are structural cross-sectional views illustrating the individual process steps of a method for fabricating a semiconductor device according to a second embodiment of the present invention.
Figure 7B:
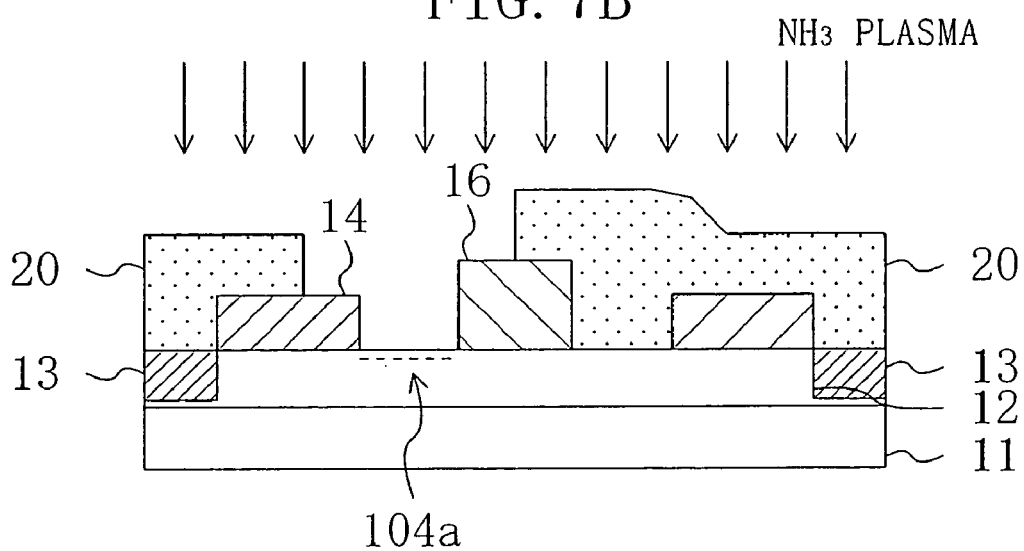
Figure 7C:
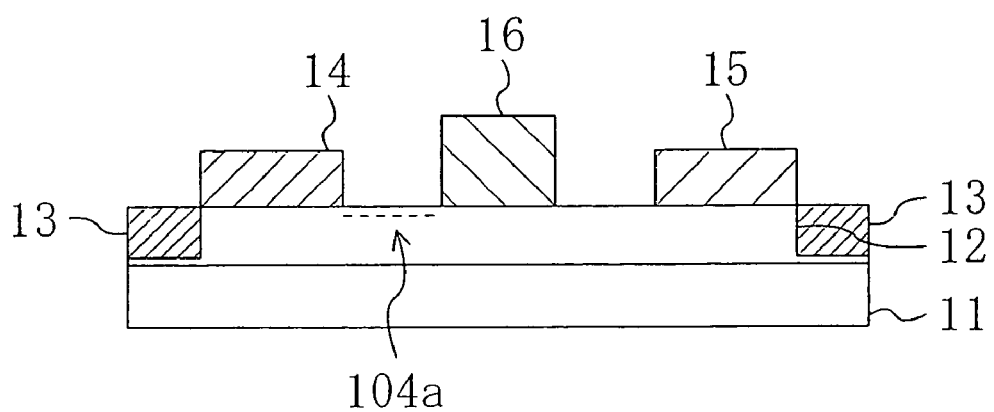

FIGS. 7A to 7C show respective cross-sectional structures of the MESFET according to the second embodiment in the individual process steps of the fabrication method therefor.

First, as shown in FIG. 7A, an epitaxial layer 12 is formed by, e.g., MOCVD on a principal surface of a substrate 11 made of sapphire. Then, a multilayer film is formed by vacuum deposition by successively depositing titanium (Ti) with a thickness of about 20 nm and aluminum (Al) with a thickness of about 100 nm on the epitaxial layer 12. Subsequently, a source electrode 14 and a drain electrode 15 are formed by a lift-off process from the formed multilayer film. Thereafter, a heat treatment is performed in a hydrogen atmosphere at a temperature of about 550° C. for 1 minute. Subsequently, a metal film composed of, e.g., nickel (Ni) with a thickness of about 200 nm is deposited by vacuum deposition and a gate electrode 16 is formed by a lift-off process from the deposited metal film.

Next, as shown in FIG. 7B, a resist pattern 20 having an opening corresponding to the region of the epitaxial layer 12 located between the source and gate electrodes 14 and 16 is formed by lithography so that the epitaxial layer is 12 exposed to an ammonia ($NH_3$) plasma under the conditions B mentioned above by using the formed resist pattern 20 as a mask.

By the plasma process, the modified layer 104a obtained by modifying the surface region of the third semiconductor layer 104 composed of AlGaN by using the ammonia plasma is formed in the surface region of the epitaxial layer 12 located between the source and gate electrodes 14 and 16.

Next, the resist pattern 20 is removed as shown in FIG. 7C, whereby the MESFET according to the second embodiment is obtained.

Thus, according to the second embodiment, a threshold voltage in the region of the epitaxial layer 12 located between the source and gate is reduced by a value as large as about 10 V (increased in the absolute value thereof) compared with a threshold voltage in the region of the epitaxial layer 12 immediately under the gate electrode 16. On the other hand, a sheet resistance between the source and gate does not change significantly even when a gate voltage is applied and holds a low resistance value. Accordingly, the source resistance of the MESFET according to the present embodiment is reduced positively.

A drain current when the gate voltage is 2 V shows a high value of 800 mA/mm, while a knee voltage is held at 8 V. It was recognized that the value of the transconductance exhibited an increase of about 50% compared with the case where the plasma process under the conditions B was not performed. Since the plasma process has not been performed with respect to the region of the epitaxial layer 12 located between the drain and gate, a drain breakdown voltage as high as 100 V or more is obtained.

Embodiment 3

A third embodiment of the present invention will be described with reference to the drawings.

Figure 8:
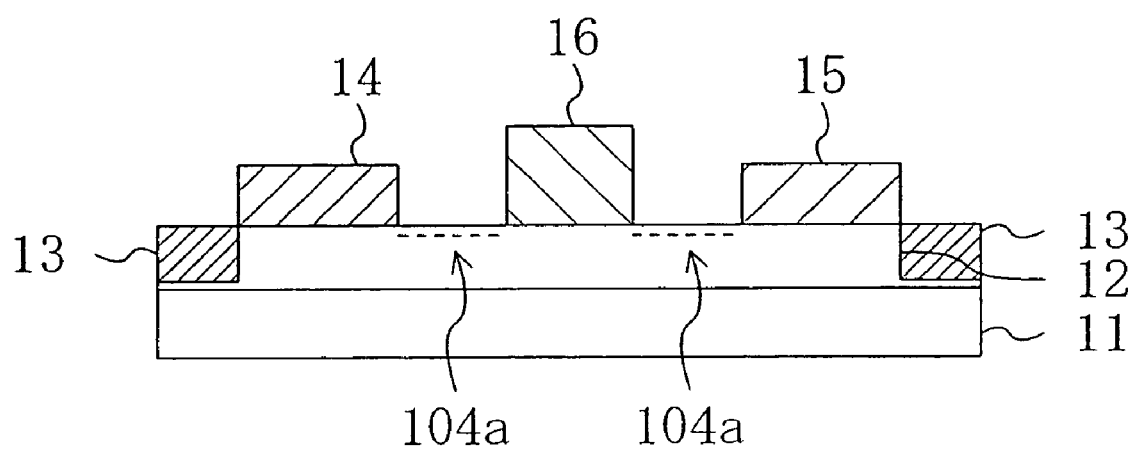
FIG. 8 is a structural cross-sectional view of a semiconductor device according to a third embodiment of the present invention.

FIG. 8 shows a cross-sectional structure of a MESFET as a semiconductor device according to the third embodiment. The description of the components which are shown in FIG. 8 and also shown in FIG. 6 will be omitted by retaining the same reference numerals.

The third embodiment is characterized in that a modified layer 104a obtained by exposing the surface of an epitaxial layer 12 to an ammonia plasma is formed in each of the respective surface regions of the epitaxial layer 12 located between a source electrode 14 and a gate electrode 16 and between the gate electrode 16 and a drain electrode 15. A material composing the substrate 11 is not limited to sapphire. Silicon carbide (SiC) may also be used instead.

The structure reduces a threshold voltage in each of the regions located between the source and gate and the gate and drain by a value as large as about 10 V, compared with a threshold voltage in a region immediately under the gate electrode 16. The resulting structure is equivalent to a structure in which $n^+$ regions are formed between the respective regions of the epitaxial layer 12 located between the source and gate and between the gate and drain, which remarkably improves the knee voltage of the MESFET. Specifically, a maximum drain current of 800 mA/mm is obtained when a knee voltage is 5 V. In addition, the value of the transconductance is further increased to 180 ms/mm.

Although the drain breakdown voltage was expected to be lower, a high value of 100 V or more was actually obtained. The cause for the drain breakdown voltage that had not been reduced remains unknown at present.

Embodiment 4

A fourth embodiment of the present invention will be described with reference to the drawings.

Figure 9:
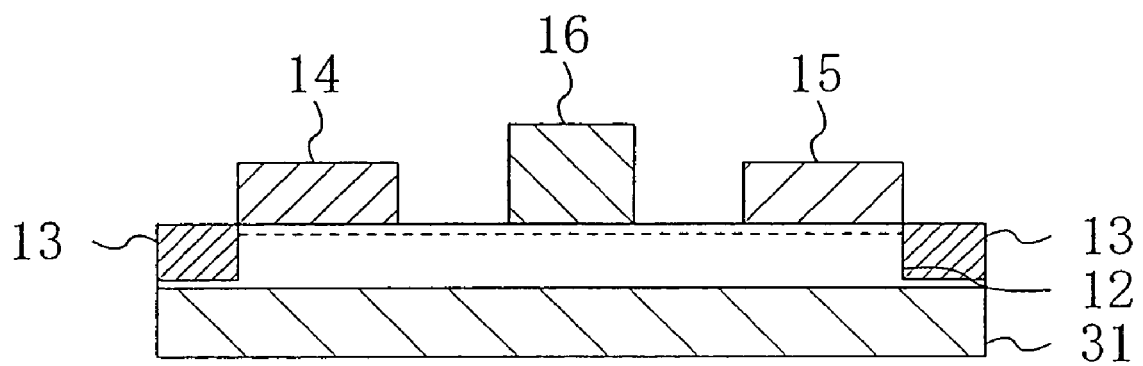
FIG. 9 is a structural cross-sectional view of a semiconductor device according to a fourth embodiment of the present invention.

FIG. 9 shows a cross-sectional structure of a MESFET as a semiconductor device according to the fourth embodiment. The description of the components which are shown in FIG. 9 and also shown in FIG. 1 will be omitted by retaining the same reference numerals.

As shown in FIG. 9, the MESFET according to the fourth embodiment has a structure equal to that of the MESFET according to the first embodiment except that a silicon carbide (SiC) is used for a substrate 31 on which an epitaxial layer 12 is grown.

Figure 10:
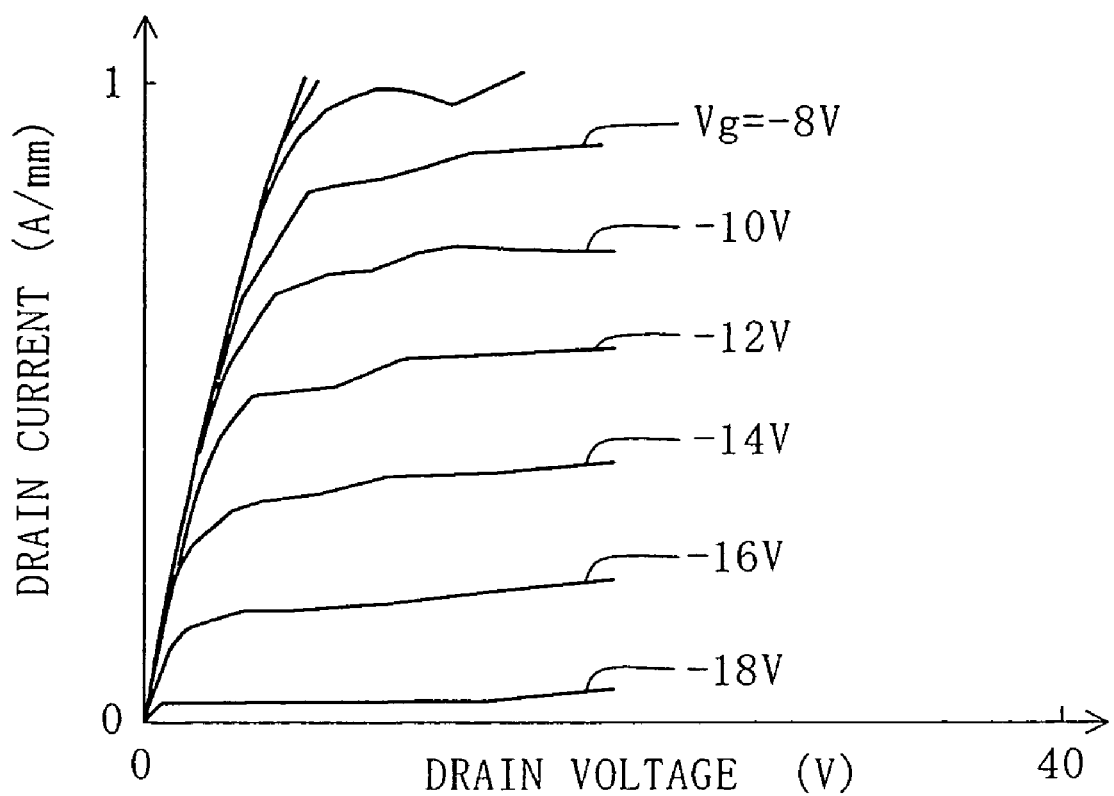
FIG. 10 is a graph showing a drain power-voltage characteristic in the semiconductor device according to the fourth embodiment.

FIG. 10 shows a drain current-voltage characteristic in the MESFET according to the fourth embodiment. As shown in FIG. 10, the MESFET according to the present embodiment has an extremely low (deep) threshold voltage of −20 V and an extremely large maximum drain current of 1.4 A/mm. A factor which renders the fourth embodiment different from the first embodiment may be the activated state of silicon as a dopant n-type impurity which is greatly different from that in the epitaxial layer 12 according to the first embodiment because a film quality at the surface of the epitaxial layer 12 composed of AlGaN is excellent in the present embodiment.

The drain current value of 1.4 A/m is equal to the maximum saturation current value before the gate electrode 16 is formed. It follows therefore that the maximum current value allowed to flow by performing a plasma process is obtainable even after the gate electrode 16 is formed.

Since the threshold voltage is excessively deep, the knee voltage is 7 V, which is slightly large but has proved to be acceptable since a drain current value of 800 mA/mm has been obtained. By thus performing the plasma process under the conditions B, a MESFET with a high drain current can be obtained reliably.

From the drain current-voltage characteristic shown in FIG. 10, it can be seen that a drain current has not lowered even at a high current value when the drain voltage is high since silicon carbide is used for the substrate 31.

What is notable is a drain-gate breakdown voltage. An off-state leakage current when the drain voltage is 100 V is as small as 2 μA in a MESFEAT with a gate width of 100 μm, though it is not depicted. This indicates that an extremely excellent breakdown voltage has been obtained.

The detailed reason for the achievement of such a high drain breakdown voltage in the structure to which such a plasma process as to achieve a deep threshold voltage in the region between the gate and drain has been performed remains unknown.

Embodiment 5

A fifth embodiment of the present invention will be described with reference to the drawings.

In a semiconductor device according to the fifth embodiment, the plasma process under the conditions B is performed with respect to the region of at least one of a plurality of MESFETs formed on a single substrate which includes at least a gate electrode formation region. As a result, the FET to which the plasma process has been performed has a deep threshold voltage, while the other MESFETs to the plasma process has not been performed have shallow threshold voltages, so that the MESFETs having different threshold voltages are formed easily on the single substrate.

A method for fabricating the semiconductor device can easily be implemented by selectively masking the MESFETs to which the plasma process has not been performed and thereby preventing them from being exposed to a plasma.

If a substrate having conditions which allow the formation of a MESFET having a threshold voltage of 0 V or more when a plasma process (i.e., an enhancement FET) is performed thereto is used, the plasma process performed to at least one of the plurality of MESFETs achieves a negative threshold voltage in at least the one of the MESFETs so that a depletion FET is formed and a logic IC based on an E/D inverter is implemented easily.

As described above, the present invention exposes the surface of a group III-V nitride semiconductor to an ammonia plasma in an atmosphere under a pressure lower than 133 Pa, preferably not more than 100 Pa, and thereby significantly reduces a potential for electrons in the surface region exposed to the plasma.

This simultaneously achieves a reduction in source resistance, an increase in drain current, and an increase in drain breakdown voltage in a GaN-based FET so that the operating characteristics of the GaN-based FET and a FET with a heterojunction structure are greatly improved.

Although each of the embodiments has used ammonia to generate the plasma for reducing the surface potential, the present invention is not limited to ammonia. The same effects are achievable even if nitrogen ($N_2$) gas, argon (Ar) gas, or hydrogen ($H_2$) gas is used under a pressure not more than 100 Pa.

What is claimed is:

1. A method for fabricating a semiconductor device, the method comprising the steps of:
   (a) selectively forming an ohmic electrode and a gate electrode on an active region composed of a group III-V nitride semiconductor; and
   (b) exposing the active region to an ammonia plasma by using the ohmic electrode and the gate electrode as a mask to reduce a surface potential for an electron in an exposed region of the active region,
   wherein the step (b) is performed under a pressure not more than 100 Pa.

* * * * *